(12) United States Patent
Sakakibara

(10) Patent No.: US 12,317,670 B2
(45) Date of Patent: May 27, 2025

(54) DISPLAY DEVICE

(71) Applicant: SHARP KABUSHIKI KAISHA, Sakai (JP)

(72) Inventor: Yusuke Sakakibara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 486 days.

(21) Appl. No.: 17/914,330

(22) PCT Filed: Apr. 14, 2020

(86) PCT No.: PCT/JP2020/016410
§ 371 (c)(1),
(2) Date: Sep. 24, 2022

(87) PCT Pub. No.: WO2021/210061
PCT Pub. Date: Oct. 21, 2021

(65) Prior Publication Data
US 2023/0110156 A1    Apr. 13, 2023

(51) Int. Cl.
| H10K 50/15 | (2023.01) |
| G09F 9/00 | (2006.01) |
| G09F 9/30 | (2006.01) |
| G09G 3/20 | (2006.01) |
| H10K 50/16 | (2023.01) |
| H10K 59/80 | (2023.01) |
| H10K 102/00 | (2023.01) |

(52) U.S. Cl.
CPC ............ *H10K 50/15* (2023.02); *H10K 50/16* (2023.02); *H10K 2102/331* (2023.02)

(58) Field of Classification Search
CPC ........ H10K 50/15; H10K 50/16; H10K 59/80; G09G 3/20; G09G 3/3233; G09F 9/00; G09F 9/30
See application file for complete search history.

(56) References Cited

U.S. PATENT DOCUMENTS

| 6,229,508 B1 | 5/2001 | Kane | |
| 2001/0024186 A1* | 9/2001 | Kane | G09G 3/3291 345/82 |
| 2008/0036369 A1* | 2/2008 | Tokuda | H05B 33/14 313/504 |

(Continued)

FOREIGN PATENT DOCUMENTS

| JP | H11219146 A | 8/1999 |
| JP | 2003330418 A | 11/2003 |
| JP | 2006089728 A | 4/2006 |

*Primary Examiner* — Omar F Mojaddedi
(74) *Attorney, Agent, or Firm* — ScienBiziP, P.C.

(57) ABSTRACT

A display device including a light-emitting element including a first electrode, a second electrode, a light-emitting layer, a first charge transport layer having a function of transporting first charge, and a second charge transport layer having a function of transporting second charge, in which the display device includes a first inspection element including a fourth electrode and a third electrode. The first inspection element is a single-charge element including the light-emitting layer and the first charge transport layer that are common to the light-emitting element and making mainly the first charge flow, and the light-emitting element is driven in accordance with characteristics of the first inspection element.

20 Claims, 14 Drawing Sheets

(56) References Cited

U.S. PATENT DOCUMENTS

| | | | |
|---|---|---|---|
| 2009/0051275 A1* | 2/2009 | Kobayashi | H10K 59/876 |
| | | | 257/E21.007 |
| 2019/0027076 A1* | 1/2019 | Lee | H10K 59/131 |
| 2020/0168763 A1* | 5/2020 | Min | H10K 50/17 |
| 2020/0243789 A1* | 7/2020 | Makishi | H10K 50/15 |
| 2021/0202658 A1* | 7/2021 | Shim | H10K 59/124 |
| 2021/0242294 A1* | 8/2021 | Bang | H10K 71/70 |

* cited by examiner

DISPLAY DEVICE

TECHNICAL FIELD

The disclosure relates to a display device.

BACKGROUND ART

PTL 1 discloses a method of detecting current and voltage characteristics of a light-emitting element of a subpixel and driving the light-emitting element in accordance with detection results thereof.

CITATION LIST

Patent Literature

PTL 1: JP 2003-330418 A

SUMMARY

Technical Problem

A method (external compensation) of PTL 1 has a problem that light-emission characteristics cannot be applied to a light-emitting element in which light-emission characteristics greatly depend on electron injection or hole injection.

Solution to Problem

A display device according to an aspect of the disclosure is a display device provided with a light-emitting element including, for each subpixel, a first electrode, a second electrode, a light-emitting layer provided between the first electrode and the second electrode, a first charge transport layer provided between the first electrode and the light-emitting layer, and a second charge transport layer provided between the light-emitting layer and the second electrode, the display device including a first inspection element including a third electrode and a fourth electrode, in which the first inspection element includes the light-emitting layer and the first charge transport layer that are provided between the third electrode and the fourth electrode and shared by the light-emitting element, and the light-emitting element is driven in accordance with characteristics of the first inspection element.

Advantageous Effects of Disclosure

According to an aspect of the disclosure, external compensation can also be achieved for a light-emitting element in which light-emission characteristics greatly depend on electron injection or hole injection.

DESCRIPTION OF EMBODIMENTS

First Embodiment

Figure 1:
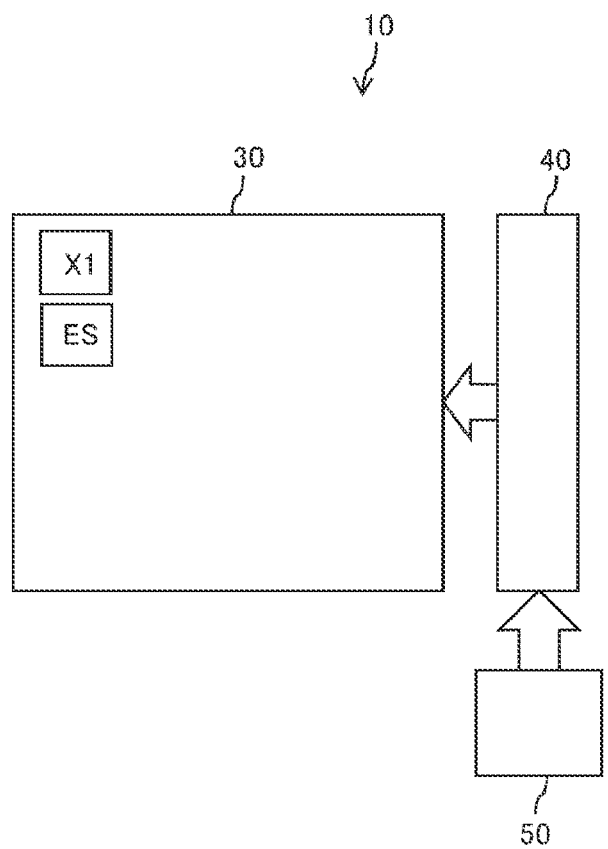
FIG. 1 is a block diagram illustrating a configuration of a display device according to a first embodiment.

FIG. 1 is a block diagram illustrating a configuration of a display device according to a first embodiment. FIG. 2(a) is a cross-sectional view illustrating a configuration of a display portion, and FIG. 2(b) is an equivalent circuit diagram of FIG. 2(a). As illustrated in FIG. 1, a display device 10 includes a display portion 30, a drive unit 40 that drives the display portion 30, and a controller 50 that controls the drive unit 40. In the display portion 30, a light-emitting element ES is formed for each subpixel, a first inspection element X1 is formed for each one or a plurality of subpixels, and the light-emitting element ES is driven in accordance with characteristics of the first inspection element X1.

Figure 2:
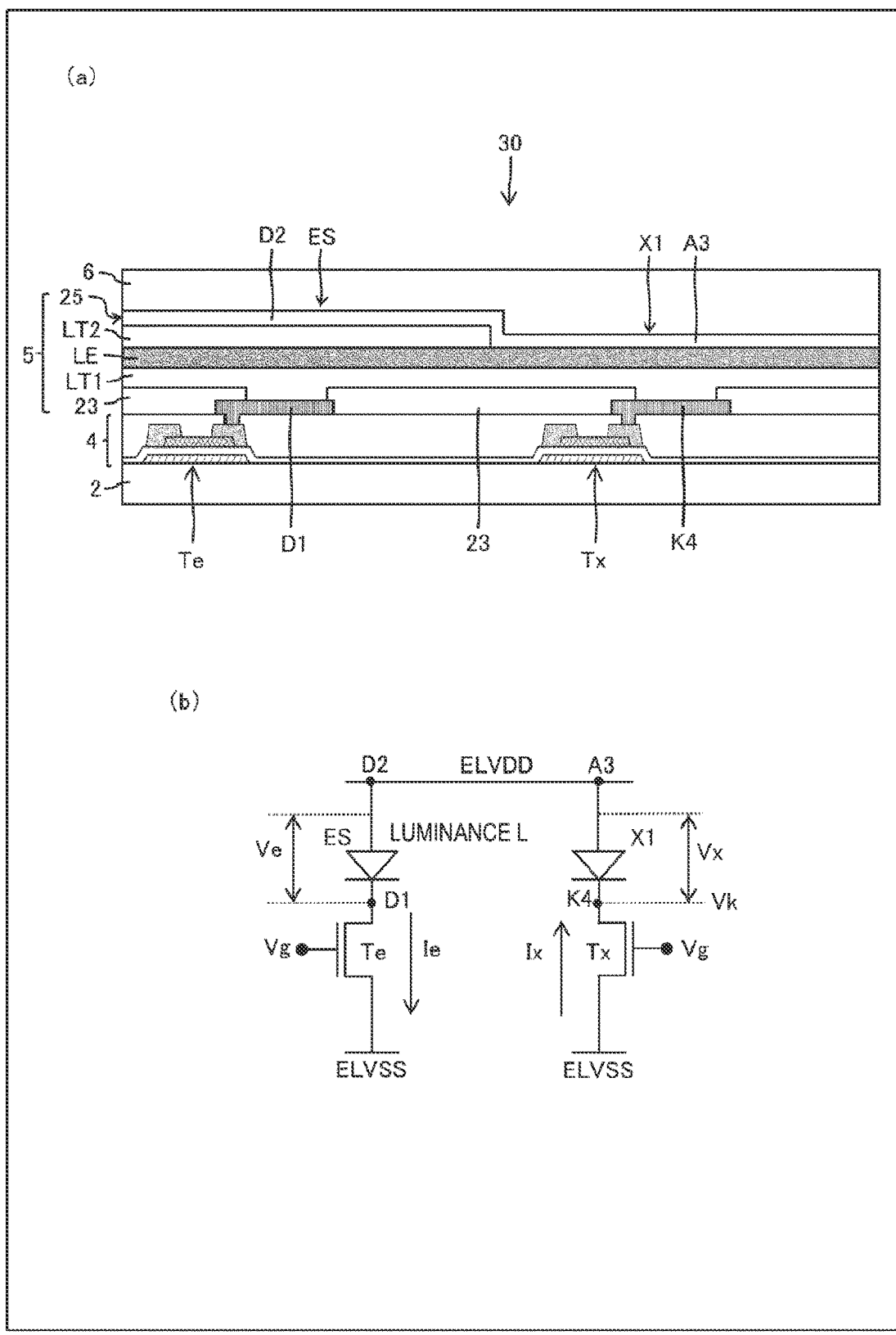
FIG. 2(a) is a cross-sectional view illustrating a configuration of a display portion.
FIG. 2(b) is an equivalent circuit diagram of FIG. 2(a).

As illustrated in FIG. 2, in the display portion 30, a TFT layer (thin film transistor layer) 4, a light-emitting element layer 5, and a sealing layer 6 are formed in that order on a substrate 2, and the light-emitting element layer 5 includes the light-emitting element ES (for example, a quantum dot light emitting diode) and a first inspection element X1.

The light-emitting element ES includes a first electrode D1, a second electrode D2 facing the first electrode D1, a light-emitting layer LE provided between the first electrode D1 and the second electrode D2, a first charge transport layer LT1 provided between the first electrode D1 and the light-emitting layer LE and having a function of transporting first charge, and a second charge transport layer LT2 provided between the light-emitting layer LE and the second electrode D2 and having a function of transporting second charge.

The first inspection element X1 includes a third electrode A3, a fourth electrode K4, and the light-emitting layer LE and the first charge transport layer LT1 which are provided between the third electrode A3 and the fourth electrode K4 and shared with the light-emitting element ES. Specifically, the light-emitting layer LE of the present embodiment is provided to be continuous (continuously) in the light-emitting element ES and the first inspection element X1 provided adjacent to the light-emitting element ES. In addition, the first charge transport layer LT1 of the present embodiment is provided to be continuous (continuously) in the light-emitting element ES and the first inspection element X1 provided adjacent to the light-emitting element ES. In FIG. 1, first charge is electrons, second charge is holes, and the first inspection element X1 is a single-charge element, specifically, an electron-only device (EOD) that makes mainly the former (electrons) out of the first charge and the second charge flow. In the first inspection element X1, the light-emitting layer LE and the third electrode A3 are in contact with each other.

In the present embodiment, the first electrode D1 (cathode) is connected to an ELVSS power supply (low potential side power supply) via a transistor Te, and the fourth electrode K4 is connected to the ELVSS power supply via a transistor Tx. The second electrode D2 and the third electrode A3 constitute a continuous common electrode (common anode) 25. The common electrode 25 is connected to an ELVDD power supply (high potential side power supply).

As the substrate 2, a glass substrate or a flexible substrate containing a resin such as polyimide as a main component can be used. A barrier layer that acts a barrier to foreign matter such as water or oxygen may be provided on an upper surface of the substrate 2.

The first electrode D1 is a light reflecting electrode and is constituted by, for example, a layer including Al (aluminum), Ag (silver), or an alloy containing Ag. An edge cover film 23 covers edge portions of each of the first electrode D1 and the fourth electrode K4, and exposes a non-edge portion. The light-emitting layer LE includes quantum dots that emit light of any one of blue, red, and green. The common electrode 25 is constituted by a metal thin film of such as ITO (Indium Tin Oxide) or a magnesium-silver alloy and has light transmittance. However, the light-emitting layer LE may include an organic light-emitting material that emits light of any one of blue, red, and green.

In the light-emitting element ES, holes and electrons are recombined in the light-emitting layer LE by a drive current between the first electrode D1 and the second electrode D2 (common electrode 25), and light is emitted in the process of the resultant excitons transitioning from a conduction band level of the quantum dots to a valence band level.

Figure 3:
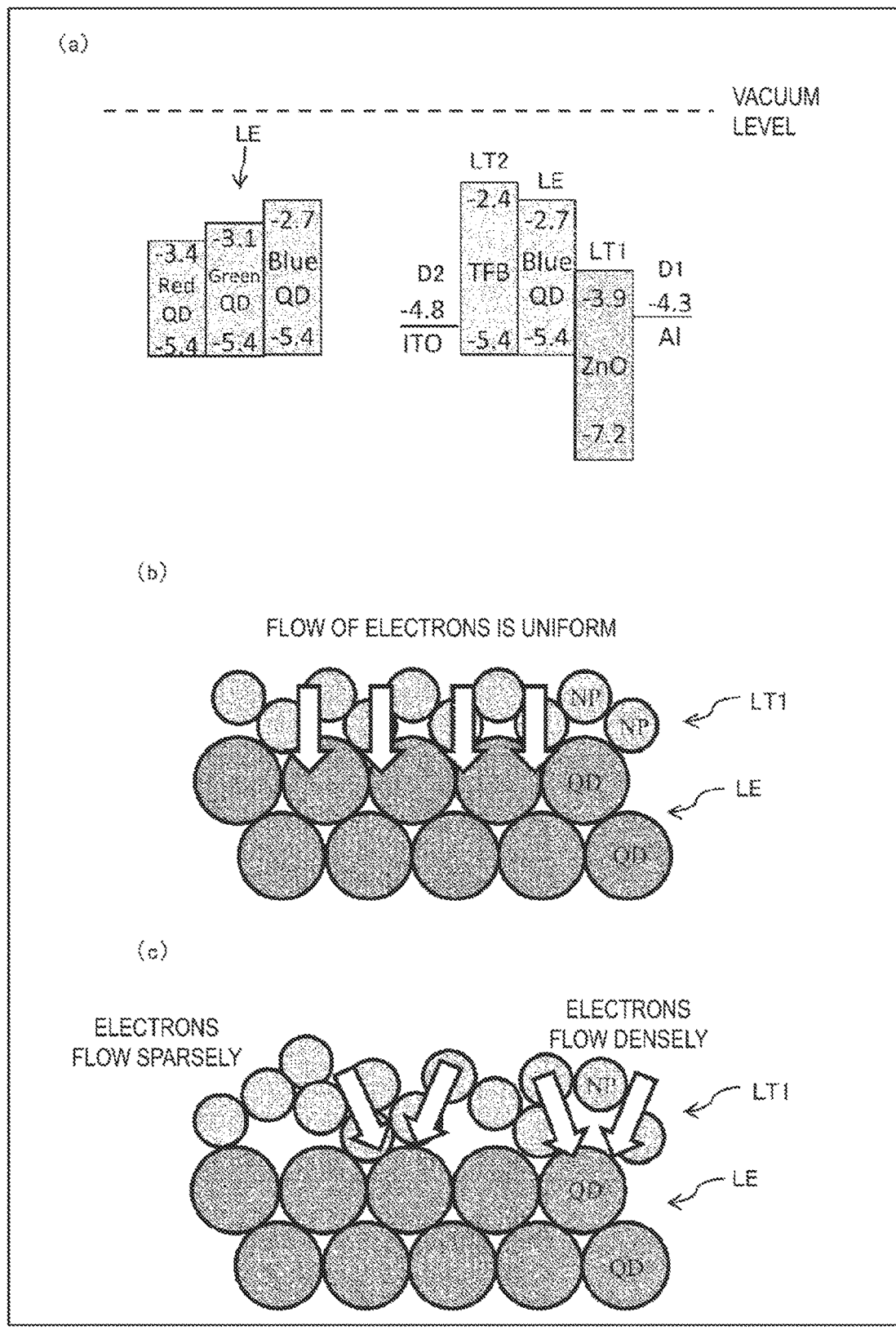
FIG. 3(a) is a band gap diagram of a light-emitting element, and FIGS. 3(b) and (c) are schematic views illustrating the state of an electron current in the light-emitting element.

FIG. 3(a) is a band gap diagram of a light-emitting element, and FIGS. 3(b) and (c) are schematic views illustrating the state of an electron current in the light-emitting element. FIG. 3 illustrates a case where a band gap is changed in accordance with a particle size of a quantum dot QD (including a core including CdSe and a shell including ZnS), and an emission wavelength is set to be red, green, and blue. In the light-emitting element ES, a conduction band level of quantum dots QD of blue light emission is particularly shallow (for example, −2.7 eV), and electrons are unlikely to be injected. For this reason, it is necessary to improve electron injection by the first charge transport layer (electron transport layer) LT1 having a shallow conduction band level, and electron injection from the first charge transport layer LT1 to the quantum dot QD greatly affects characteristics of the light-emitting element.

The electron injection also greatly affects the state of an interface between the first charge transport layer LT1 and the quantum dot QD and the state of an interface between the first charge transport layer LT1 and the first electrode D1. In particular, as illustrated in FIGS. 3(b) and (c), in a case where nanoparticles NP containing a metal oxide such as ZnO, $SnO_2$, or $TiO_2$ are used in the first charge transport layer LT1, the state of these interfaces tends to vary for each application (each light-emitting element), and thus characteristics of the light-emitting element vary.

For example, as illustrated in FIG. 3(b), electrons flow uniformly at an interface having no deviation of nanoparticles NP, and the QD also emits light uniformly, and thus it is assumed that deterioration of the light-emitting element proceeds uniformly. For example, electrons flow sparsely or densely at an interface where nanoparticles NP are disposed in a biased manner as illustrated in FIG. 3(b), light emission of the QD having a large amount of electron injection is increased, and light emission of the QD having a small amount of electron injection is reduced. In the QD having a large amount of light emission, the deterioration of QD proceeds faster than QD having a small amount of light emission. For this reason, QD having a high degree of deterioration and QD having a low degree of deterioration are mixed in the light-emitting element, and it is assumed that the deterioration of the entire element proceeds fast under the influence of QD having a high degree of deterioration.

FIG. 4(a) is a graph showing current and voltage characteristics of the light-emitting element ES (hole), FIG. 4(b) is a graph showing luminance and voltage characteristics of the light-emitting element ES, FIG. 4(c) is a graph showing (electron) current and voltage characteristics of the inspection element X1 (EOD), and FIG. 4(d) is a graph showing a relationship between the voltage of the inspection element X1 (EOD) and the luminance of the light-emitting element.

Figure 4:
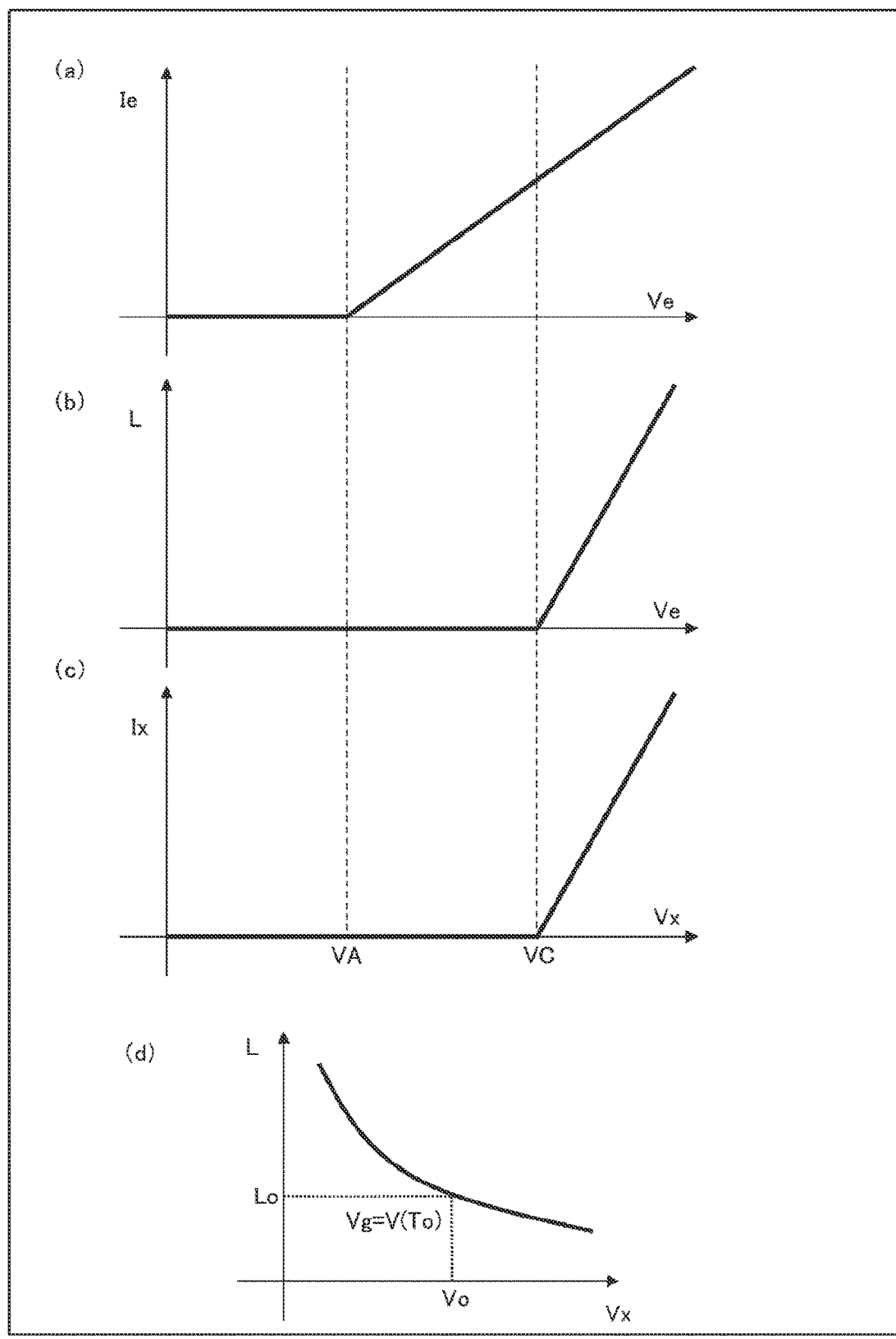
FIG. 4(a) is a graph showing (hole) current and voltage characteristics of the light-emitting element.
FIG. 4(b) is a graph showing luminance and voltage characteristics of the light-emitting element.
FIG. 4(c) is a graph showing (electron) current and voltage characteristics of an inspection element.
FIG. 4(d) is a graph showing a relationship between the voltage of the inspection element and the luminance of the light-emitting element.

As illustrated in FIG. 2 and FIG. 4, a current (hole current) Ie flowing through the light-emitting element ES rises when an anode-cathode voltage Ve is VA, an electron current Ix flowing through the first inspection element X1 rises when an anode-cathode voltage Ve is an electron injection start voltage VC (>VA), and a luminance L of the light-emitting element ES rises when an anode-cathode voltage Ve is an electron injection start voltage VC. This is because there is less injection of electrons than injection of holes.

Consequently, in FIGS. 1 and 2, in the first inspection element X1, the light-emitting layer LE and the first charge transport layer LT1 (electron transport layer) are shared with the light-emitting element ES, but an EOD that does not have a hole transport layer (HTL) is created. Electrons mainly flow through the first inspection element X1, and holes hardly flow.

Variations in the states of interfaces of the first charge transport layer LT1 and the light-emitting layer LE depend on the amount of a liquid during application, a flow rate, the concentration of a quantum dot QD dispersed solution, environmental temperature and humidity (the ease of drying of a solvent), and the like. Thus, for the light-emitting element ES and the first inspection element X1, the first charge transport layers LT1 are created in the same step, and the light-emitting layers LE are created in the same step, thereby making it possible to uniformly adjust the states of interfaces of the light-emitting element ES and the first inspection element X1.

In the first embodiment, a relationship (characteristics in FIG. 4(d)) between a voltage Vk of the fourth electrode K4 of the first inspection element X1 and a luminance L of the light-emitting element ES is acquired while changing a gate voltage Vg (gray scale signal) which is common to the transistors Te and Tx, and the acquired relationship is recorded in the controller 50 as a table. For example, a gray scale signal Vg=V (To), a luminance L of the light-emitting element ES=Lo (a luminance corresponding to a gray scale To), and a voltage Vx applied to the first inspection element X1=Vo are associated with a gray scale To of a subpixel.

In an inspection mode to be described below, when a voltage Vk of the fourth electrode K4 is measured as a gate voltage Vg=V (To), and Vx (a potential difference between Vk and ELVDD)=Vo, a gray scale signal V (To) is not corrected. When the voltage Vk of the fourth electrode K4 is measured, and Vx<Vo, an electron current tends to flow through the light-emitting element ES and the first inspection element X1, and the luminance L of the light-emitting element becomes larger than a specified Lo, and thus correction for reducing an electron current of the light-emitting element ES is performed by increasing the gray scale signal V (To). In contrast, when Vx>Vo, an electron current is unlikely to flow through the light-emitting element ES and the first inspection element X1, and the luminance L of the light-emitting element becomes smaller than a specified Lo, and thus correction for increasing an electron current of the light-emitting element ES is performed by reducing a gray scale signal V (To).

In this manner, for the light-emitting element ES in which emission characteristics greatly depend on electron injection, external compensation can be achieved based on the light-emission characteristics of the first inspection element X1 (the value of the voltage Vk of the fourth electrode with respect to the gate voltage Vg of the transistor Tx). Specifically, this reduces the influence of characteristic variations for each subpixel caused by the states of interfaces of the first charge transport layer LT1 (electron transport layer) and the light-emitting layer LE and characteristic variations due to a difference in the degree of deterioration over time, and thus desired light-emission characteristics can be obtained. Thereby, a display device with high image quality can be realized.

Figure 5:
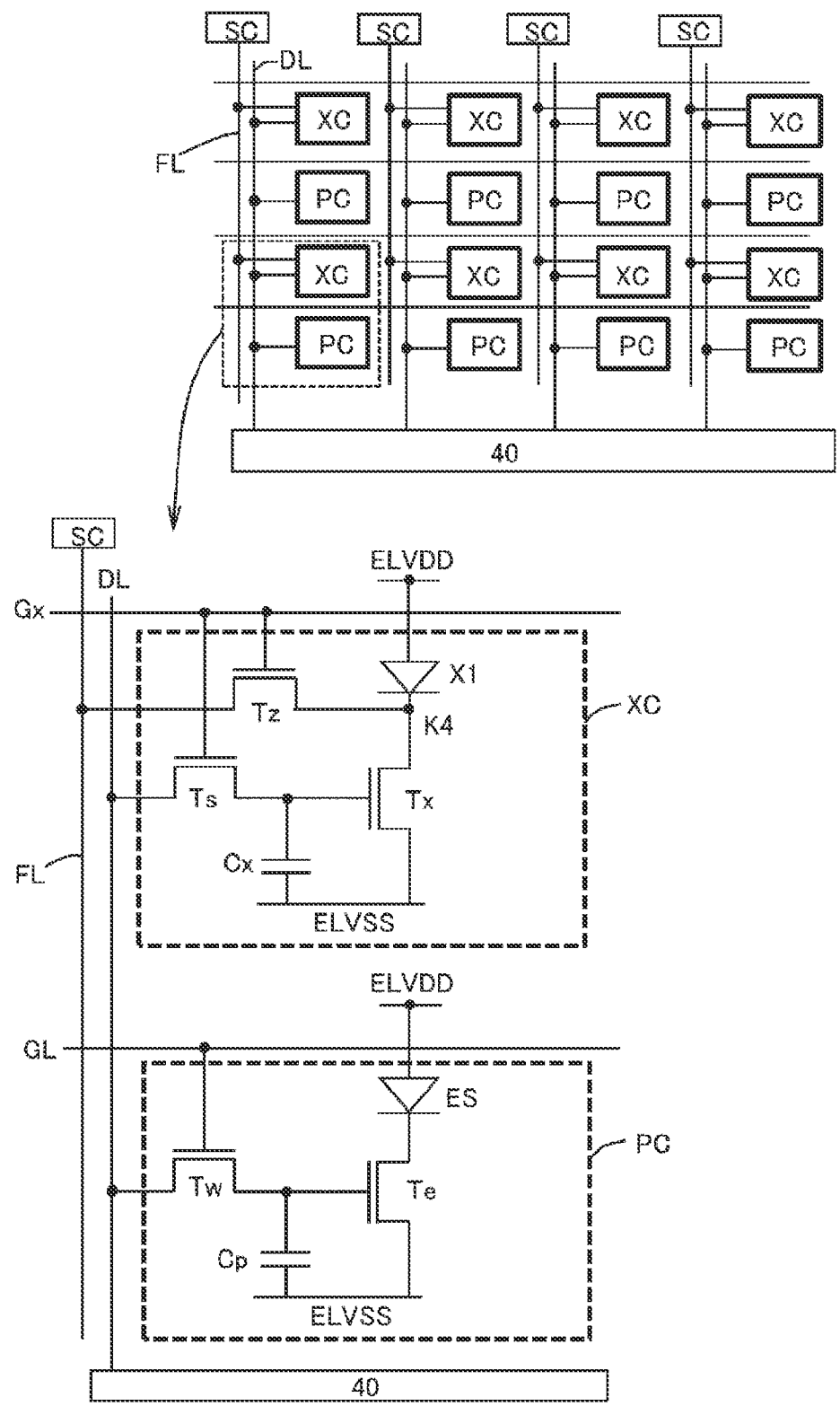
FIG. 5 is a schematic view illustrating a configuration example of an inspection circuit and a pixel circuit.

FIG. 5 is a schematic view illustrating configuration examples of an inspection circuit and a pixel circuit. In FIG. 5, an inspection circuit XC including the first inspection element X1 and a pixel circuit PC including the light-emitting element ES are provided for each subpixel. A data signal line DL, a measurement line FL, and a voltage measurement circuit SC which is a voltage measurement unit are disposed to correspond to a subpixel column.

In the inspection circuit XC, the fourth electrode K4 of the first inspection element X1 is connected to the measurement line FL via a transistor Tz, and a gate electrode of the transistor Tx is connected to the data signal line DL via a transistor Ts and is connected to the ELVSS power supply via a capacitance element Cx. A gate electrode of the transistor Ts and a gate electrode of the transistor Tz are connected to an inspection line Gx, the data signal line DL is connected to the drive unit 40, and the measurement line FL is connected to the voltage measurement circuit SC. In the pixel circuit PC, a gate electrode of the transistor Te is connected to the data signal line DL via a transistor Tw and is connected to the ELVSS power supply via a capacitance element Cp. A gate electrode of the transistor Tw is connected to a scanning signal line GL.

In FIG. 5, the scanning signal line GL is selected in a display mode, and a gray scale signal is written in the gate electrode of the transistor Te from the data signal line DL. In addition, the inspection line Gx is selected in an inspection mode, a gray scale signal is written in the gate electrode of the transistor Tx from the data signal line DL, and the voltage Vk of the fourth electrode K4 of the first inspection element X1 is measured by the voltage measurement circuit SC.

Figure 6:
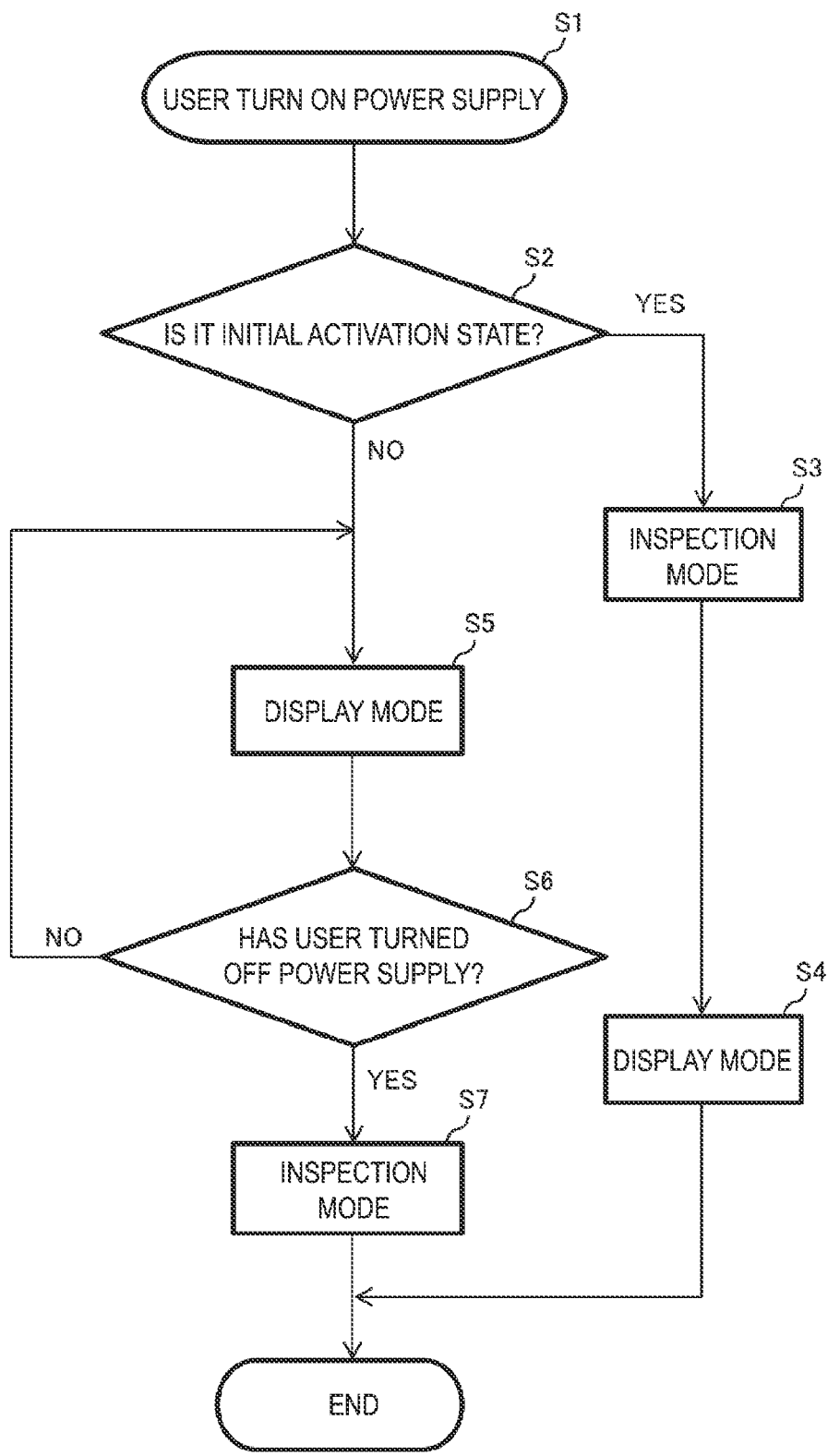
FIG. 6 is a flowchart illustrating an example of an operation of the display device.

FIG. 6 is a flowchart illustrating an example of an operation of the display device. In step S1, when a user turns on the power supply of the display device 10, the operation proceeds to step S2. When an initial activation state is set, the operation proceeds to step S3, and the controller 50 sets the display portion 30 to be in an inspection mode. In the inspection mode, the inspection circuit XC is driven, and measurement of the voltage Vk of the fourth electrode K4 and correction of a gray scale signal in FIG. 2 are performed. For example, the voltage Vk of the fourth electrode K4 in a state where a gray scale signal V (To) corresponding to a gray scale To has been written in the gate electrode of the transistor Tx is measured. The gray scale signal V (To) is not corrected in the case of Vx=Vo (a specified value in FIG. 4(d)), correction for increasing the gray scale signal V (To) is performed when Vx<Vo, and correction for reducing the gray scale signal V (To) is performed when Vx>Vo. In step S3, the influence of variations in initial characteristics of the pixel circuit PC (light-emitting element ES) can be reduced.

When step S3 ends, the process proceeds to step S4, and the controller 50 set the display portion 30 to be in the display mode. In the display mode, the pixel circuit PC is driven and displayed, and the inspection circuit XC is not driven. However, but the present disclosure is not limited thereto. Also in the display mode, the inspection circuit XC is driven, and for example, the first inspection element X1 may be driven at the same current density as the light-emitting element ES. Thereby, in the first inspection element X1 and the light-emitting element ES, the deteriorations at the charge transport layer LT1, the light-emitting layer LE, and the interfaces thereof can be uniformly adjusted, and a reduction in luminance due to deterioration of the light-emitting element ES can be corrected by using the first inspection element X1.

When an initial activation state is not set in step S2, the operation proceeds to step S5, and the controller 50 sets the display portion 30 to be in a display mode. Thereafter, when the user turns off the power supply of the display device 10 (Yes in step S6), the operation proceeds to step S7, and the controller 50 sets the display portion 30 to be in an inspection mode as in step S3. The process of step S7 is performed periodically, and thus the influence of deterioration over time of the pixel circuit PC (light-emitting element ES) can be reduced.

Although measurement of Vk and correction of a gray scale signal V (To) in the inspection mode are ideally performed for pixel circuits PC and the inspection elements X1 of three colors (R, G, B), the measurement and correction may be performed for only the pixel circuit PC and the inspection element X1 of blue color in which electron injection greatly affects light-emission characteristics. In addition, measurement of Vk and correction of a gray scale signal may be performed for each period of time regardless of the turn-on or turn-off of the power supply.

Figure 7:
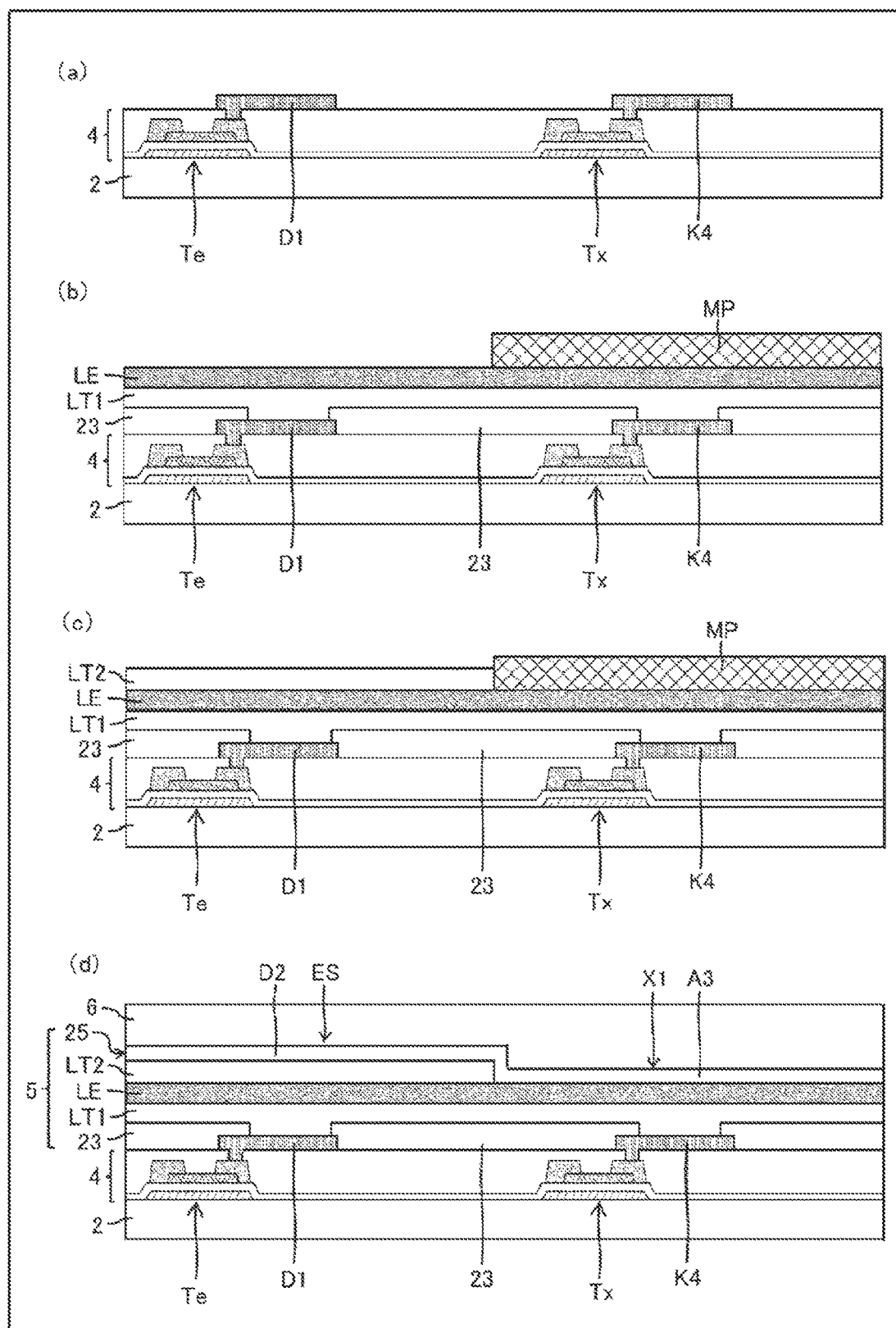
FIGS. 7(a) to (d) are cross-sectional views illustrating a method of manufacturing a display device according to a first embodiment.

FIGS. 7(a) to (d) are cross-sectional views illustrating a method of manufacturing the display device according to the first embodiment. In FIG. 7(a), the first electrode D1 and the fourth electrode K4 are formed on the TFT layer 4 including the transistors Te and Tx by using a method such as sputtering or vapor deposition. In FIG. 7(b), the first charge transport layer LT1 (electron transport layer) and the light-emitting layer LE are formed using a method such as sputtering, vapor deposition, or application, and then a mask pattern MP is disposed on the light-emitting layer LE. The mask pattern MP may be a resist mask or may be a metal mask or the like. In FIG. 7(c), the second charge transport layer LT2 (hole transport layer) is formed using a method such as sputtering, vapor deposition, or application. Subsequently, the mask pattern MP is removed to form the common electrode 25 (including the second electrode D2 and the third electrode A3) using a method such as sputtering or vapor deposition, and then the sealing layer 6 is formed to cover the common electrode 25 (FIG. 7(d)).

Second Embodiment

Figure 8:
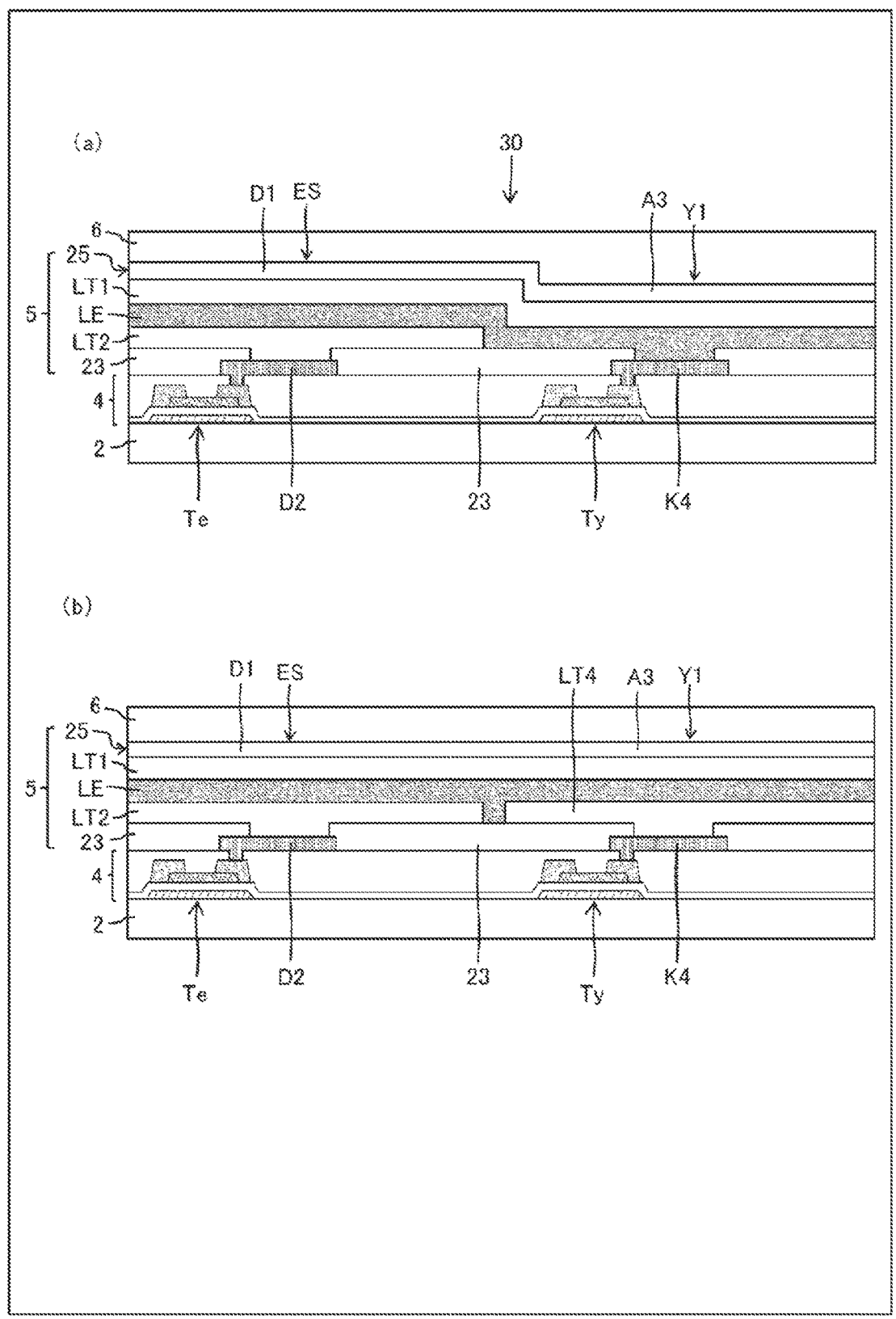
FIGS. 8(a) and (b) are cross-sectional views illustrating a configuration of a display portion according to a second embodiment.

FIGS. 8(a) and (b) are cross-sectional views illustrating a configuration of a display portion according to a second embodiment. As illustrated in FIG. 8, a display portion 30 includes a TFT layer (thin film transistor layer) 4, a light-emitting element layer 5, and a sealing layer 6 which are formed on a substrate 2 in that order. The light-emitting element layer 5 includes a light-emitting element ES (for example, a quantum dot light emitting diode) and a first inspection element Y1.

The light-emitting element ES includes a first electrode D1, a second electrode D2 facing the first electrode D1, a light-emitting layer LE provided between the first electrode D1 and the second electrode D2, a first charge transport layer LT1 provided between the first electrode D1 and the light-emitting layer LE and having a function of transporting first charge, and a second charge transport layer LT2 provided between the light-emitting layer LE and the second electrode D2 and having a function of transporting second charge.

The first inspection element Y1 includes a third electrode A3 and a fourth electrode K4, and includes the light-emitting layer LE and the first charge transport layer LT1 which are provided between the third electrode A3 and the fourth electrode K4 and common to the light-emitting element ES. In FIG. 8, the first charge is a hole, the second charge is an electron, and the first inspection element Y1 is a single-charge element, specifically, a hole-one device (HOD) that makes mainly the former (hole) out of the first charge and the second charge flow. In the first inspection element Y1, the light-emitting layer LE and the fourth electrode K4 are in contact with each other.

In the light-emitting element ES of FIG. 8, the second electrode D2, the second charge transport layer LT2 (electron transport layer), the light-emitting layer LE, the first charge transport layer LT1 (hole transport layer), and the first electrode D1 are layered in that order, and in the first inspection element Y1, the fourth electrode K4, the light-emitting layer LE, the first charge transport layer LT1 (hole transport layer), and the third electrode A3 are layered in that order. The second electrode D2 is connected to an ELVSS power supply (low potential side power supply) via a transistor Te, and the fourth electrode K4 is connected to the ELVSS power supply via a transistor Ty. The first electrode D1 and the third electrode A3 constitute a continuous common electrode (common anode) 25. The common electrode 25 is connected to an ELVDD power supply (high potential side power supply).

The first inspection element Y1 in FIG. 8 shares the light-emitting layer LE and the first charge transport layer LT1 (hole transport layer) with the light-emitting element ES, but does not include an electron transport layer (ETL), and thus holes mainly flow through the first inspection element Y1, and electrons hardly flow. For the light-emitting element ES in which light-emission characteristics greatly depend on hole injection, external compensation can be achieved by driving the light-emitting element ES in accordance with characteristics of the first inspection element Y1 which is an HOD.

Note that, as illustrated in FIG. 8(b), a fourth charge transport layer LT4 having a hole transport function may be provided between the light-emitting layer LE and the fourth electrode K4. This prevents electrons from flowing out of the fourth electrode K4 in the first inspection element Y1.

Third Embodiment

Figure 9:
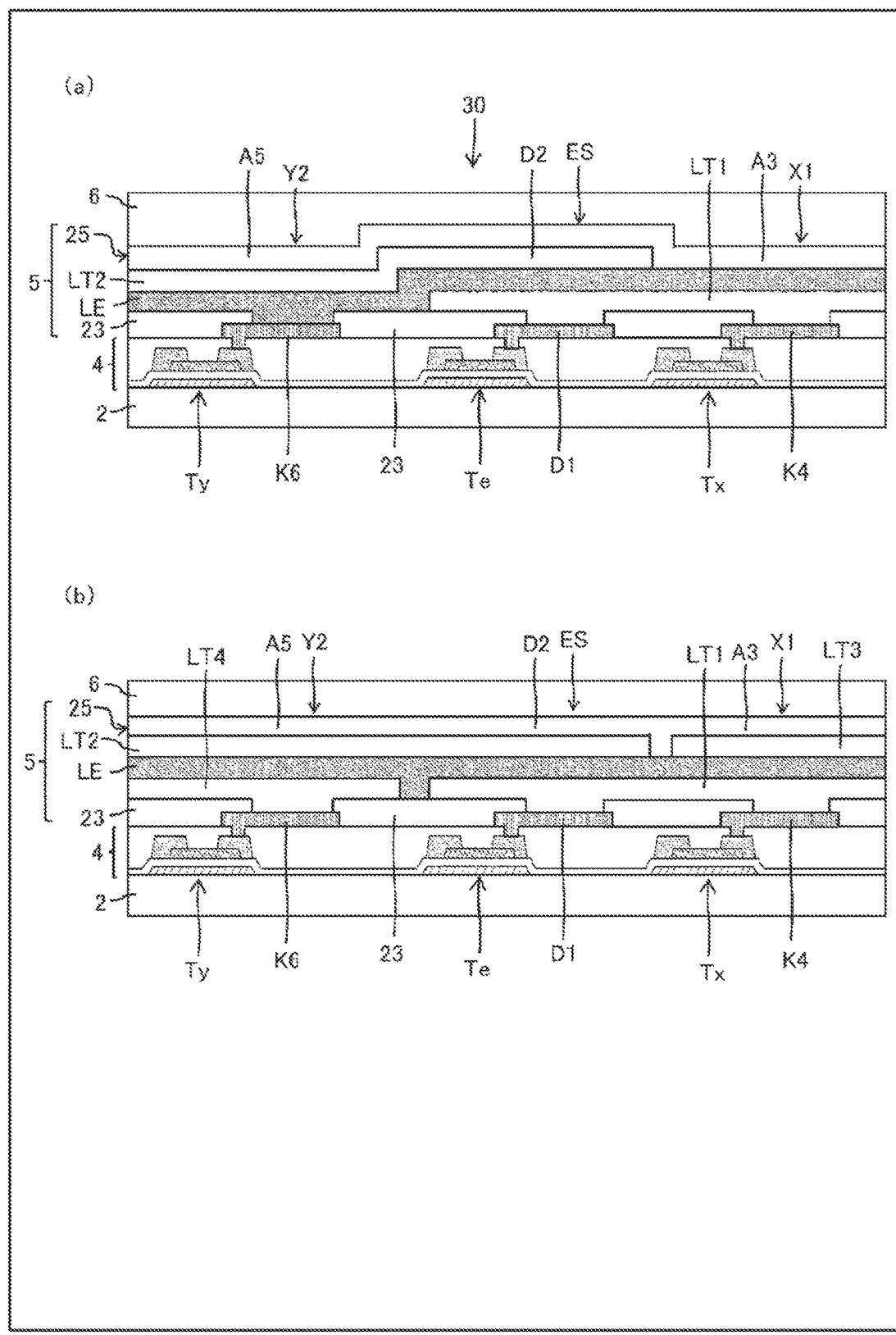
FIGS. 9(a) and (b) are cross-sectional views illustrating a configuration of a display portion according to a third embodiment.

FIGS. 9(a) and (b) are cross-sectional views illustrating a configuration of a display portion according to a third embodiment. As illustrated in FIG. 9, a display portion 30 includes a TFT layer (thin film transistor layer) 4, a light-emitting element layer 5, and a sealing layer 6 which are formed on a substrate 2 in that order. The light-emitting element layer 5 includes a light-emitting element ES (for example, a quantum dot light emitting diode), a first inspection element X1, and a second inspection element Y2.

The light-emitting element ES includes a first electrode D1, a second electrode D2 facing the first electrode D1, a light-emitting layer LE provided between the first electrode D1 and the second electrode D2, a first charge transport layer LT1 provided between the first electrode D1 and the light-emitting layer LE and having an electron transport function, and a second charge transport layer LT2 provided between the light-emitting layer LE and the second electrode D2 and having a hole transport function.

The first inspection element X1 is an EOD that includes a third electrode A3 and a fourth electrode K4, includes a light-emitting layer LE and a first charge transport layer LT1 (electron transport layer) which are provided between the third electrode A3 and the fourth electrode K4 and common to the light-emitting element ES, makes mainly electrons flow, and hardly makes holes flow (does not include a hole transport layer). In the first inspection element X1, the light-emitting layer LE and the third electrode A3 are in contact with each other.

The second inspection element Y2 is an HOD that includes a fifth electrode A5 and a sixth electrode K6, includes a light-emitting layer LE and a second charge transport layer LT2 (hole transport layer) which are provided between the fifth electrode A5 and the sixth electrode K6 and common to the light-emitting element ES, makes mainly holes flow, and hardly makes electrons flow (does not include an electron transport layer). In the second inspection element Y2, the light-emitting layer LE and the sixth electrode K6 are in contact with each other.

For the light-emitting element ES in which light-emission characteristics greatly depend on each of electron injection and hole injection, external compensation can be achieved by driving the light-emitting element ES in accordance with characteristics of the first inspection element X1 which is an EOD and characteristics of the second inspection element Y2 which is an HOD.

Note that, as in FIG. 9(b), a third charge transport layer LT3 having an electron transport function may be provided between the third electrode A3 and the light-emitting layer LE, and a fourth charge transport layer LT4 having a hole transport function may be provided between the sixth electrode K6 and the light-emitting layer LE.

Other Embodiments

Figure 10:
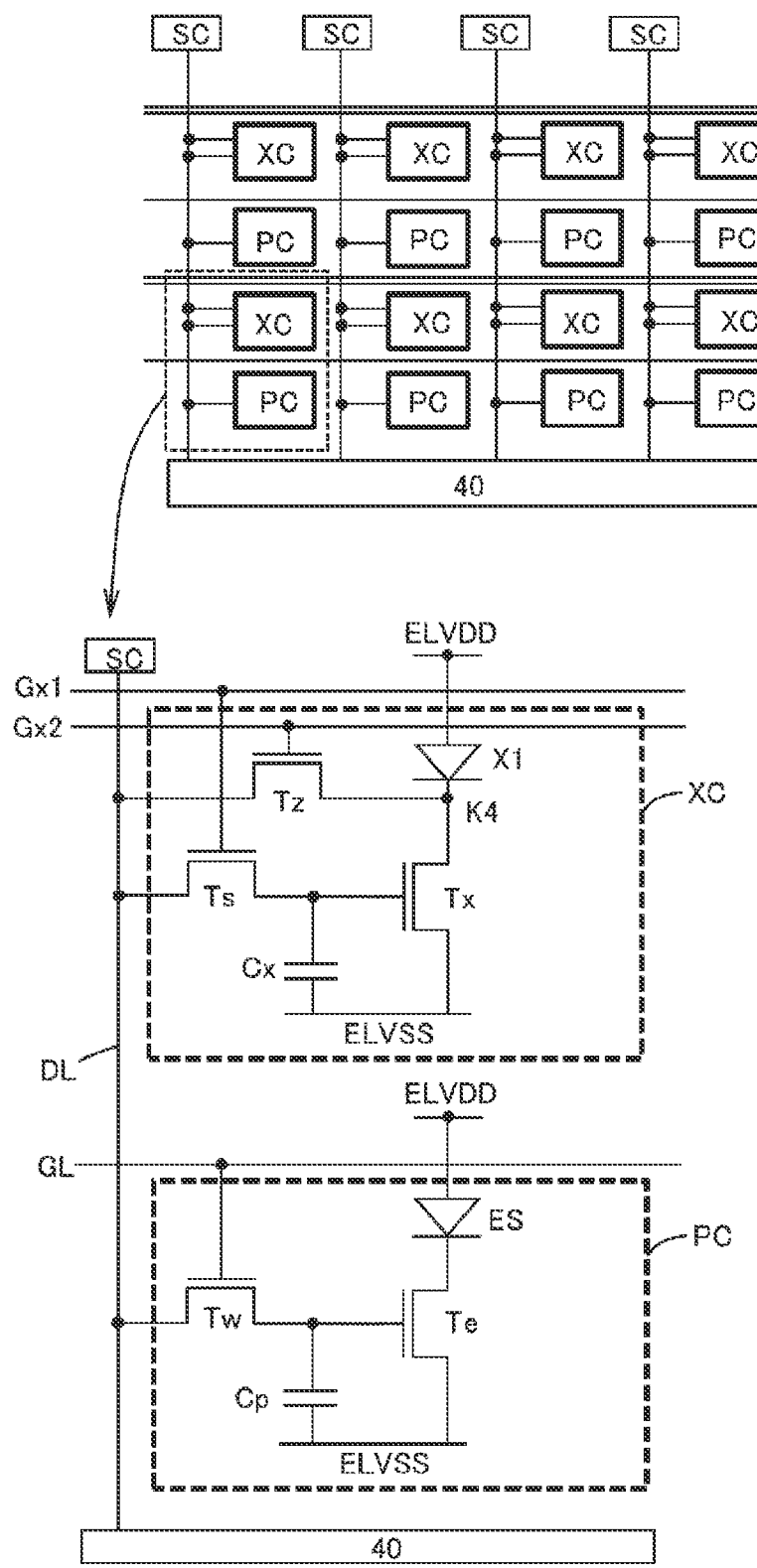
FIG. 10 is a schematic view illustrating modification examples of an inspection circuit and a pixel circuit.

FIG. 10 is a schematic view illustrating modification examples of an inspection circuit and a pixel circuit. In FIG.

10, an inspection circuit XC and a pixel circuit PC are provided for each subpixel, and a data signal line DL and a voltage measurement circuit SC are disposed to correspond to a subpixel column.

In the inspection circuit XC, a fourth electrode K4 of a first inspection element X1 is connected to the data signal line DL via a transistor Tz, and a gate electrode of a transistor Tx is connected to the data signal line DL via a transistor Ts and is connected to an ELVSS power supply via a capacitance element Cx. A gate electrode of the transistor Ts is connected to a first inspection line Gx1, a gate electrode of the transistor Tz is connected to a second inspection line Gx2, and the data signal line DL is connected to a drive unit 40 and a voltage measurement circuit SC. In the pixel circuit PC, a gate electrode of the transistor Te is connected to the data signal line DL via a transistor Tw and is connected to the ELVSS power supply via a capacitance element Cp. A gate electrode of the transistor Tw is connected to the scanning signal line GL.

In FIG. 10, a scanning signal line GL is selected in a display mode, and a gray scale signal is written in the gate electrode of the transistor Te from the data signal line DL. Further, in an inspection mode, the first inspection line Gx1 and the second inspection line Gx2 are sequentially selected, and a gray scale signal is written in the gate electrode of the transistor Tx from the data signal line DL, and then a voltage Vk of the fourth electrode K4 of the first inspection element X1 is measured by a voltage measurement circuit SC.

Figure 11:
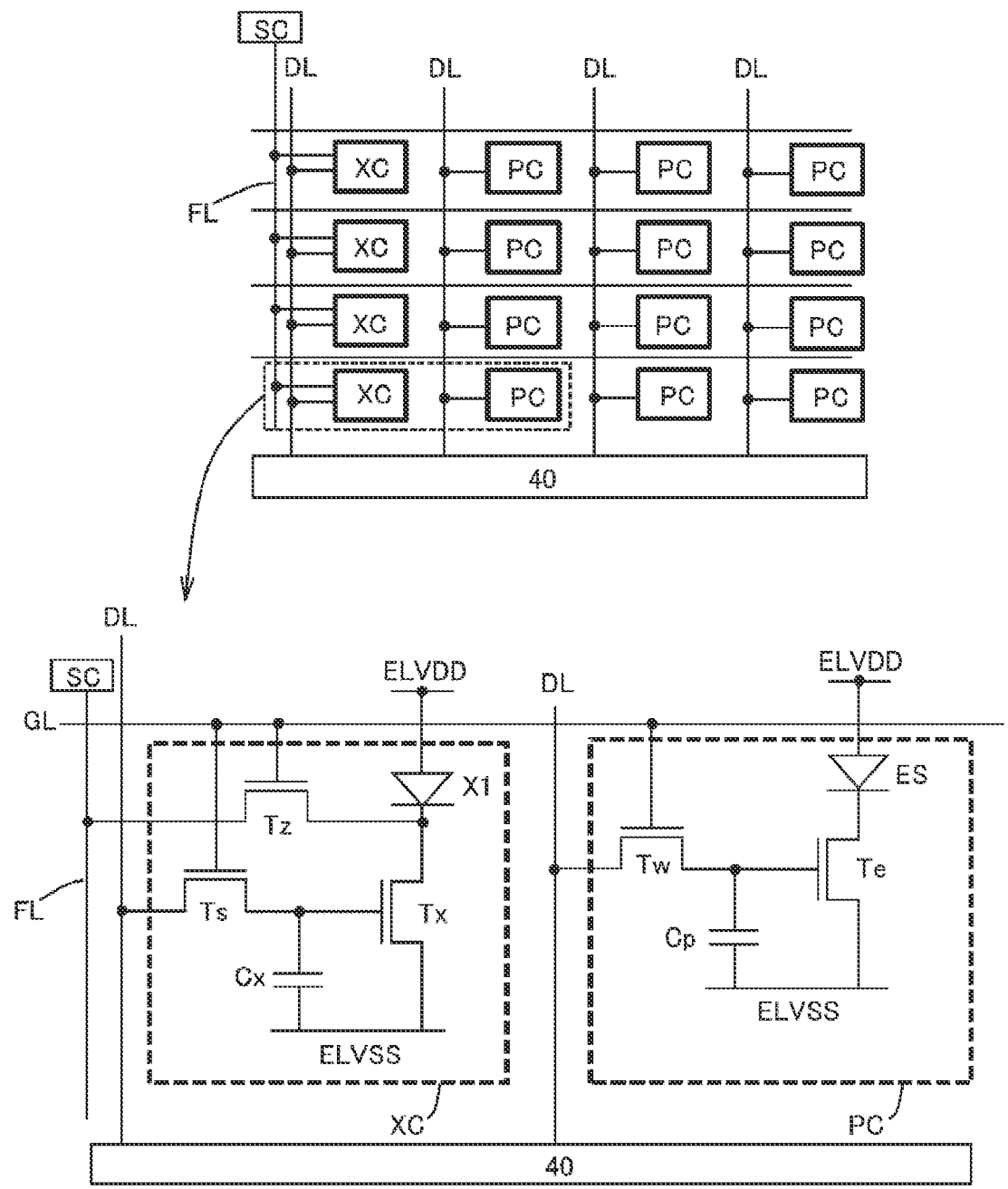
FIG. 11 is a schematic view illustrating other modification examples of an inspection circuit and a pixel circuit.

FIG. 11 is a schematic view illustrating other modification examples of an inspection circuit and a pixel circuit. In FIG. 11, a pixel circuit PC is provided for each subpixel arranged in a row direction, an inspection circuit XC is provided for each subpixel row, and a data signal line DL and a voltage measurement circuit SC are disposed corresponding to the column of the inspection circuits XC.

In the inspection circuit XC, the fourth electrode K4 of the first inspection element X1 is connected to the measurement line FL via a transistor Tz, and a gate electrode of the transistor Tx is connected to the data signal line DL via a transistor Ts and is connected to the ELVSS power supply via a capacitance element Cx. A gate electrode of a transistor Ts and a gate electrode of a transistor Tz are connected to a scanning signal line GL, the data signal line DL is connected to a drive unit 40, and a measurement line FL is connected to a voltage measurement circuit SC. In the pixel circuit PC, a gate electrode of the transistor Te is connected to the data signal line DL via a transistor Tw and is connected to the ELVSS power supply via a capacitance element Cp. A gate electrode of the transistor Tw is connected to the scanning signal line GL.

In FIG. 11, the scanning signal line GL is selected in a display mode, and a gray scale signal is written in the gate electrode of the transistor Te from the data signal line DL. In addition, the scanning signal line GL is selected in an inspection mode, and a gray scale signal is written in the gate electrode of the transistor Tx from the data signal line DL, and a voltage Vk of the fourth electrode K4 of the first inspection element X1 is measured by the voltage measurement circuit SC.

Figure 12:
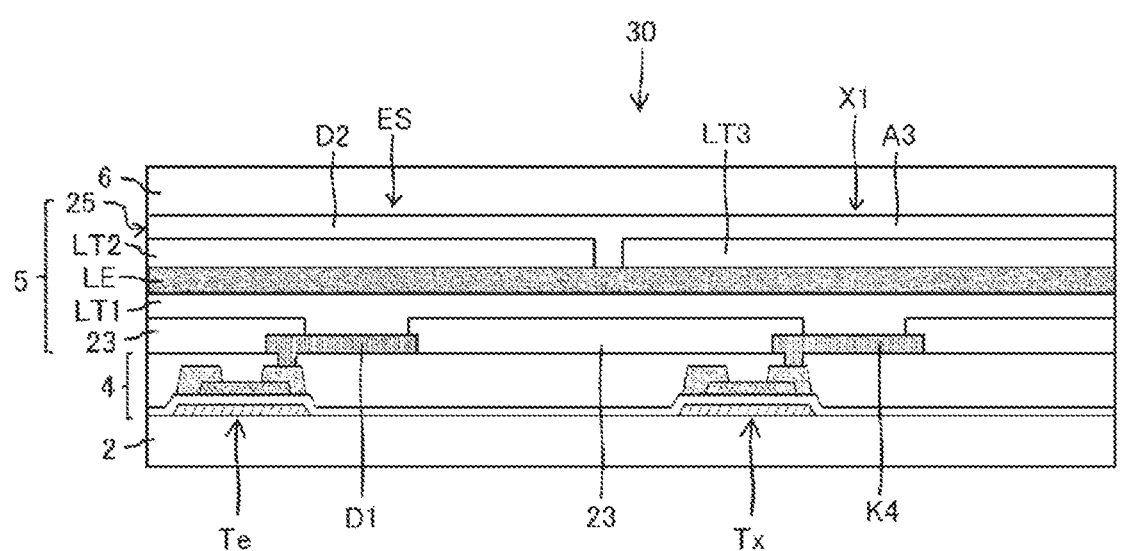
FIG. 12 is a cross-sectional view illustrating a modification example of a display portion according to the first embodiment.

FIG. 12 is a cross-sectional view illustrating a modification example of the display portion according to the first embodiment. In the first inspection element X1 in FIG. 2, the light-emitting layer LE and the third electrode A3 are in contact with each other, but this is not a limitation. As illustrated in FIG. 12, a third charge transport layer LT3 having an electron transport function may be provided between the light-emitting layer LE and the third electrode A3. In this manner, holes can be prevented from flowing out of the third electrode A3 in the first inspection element X1.

Figure 13:
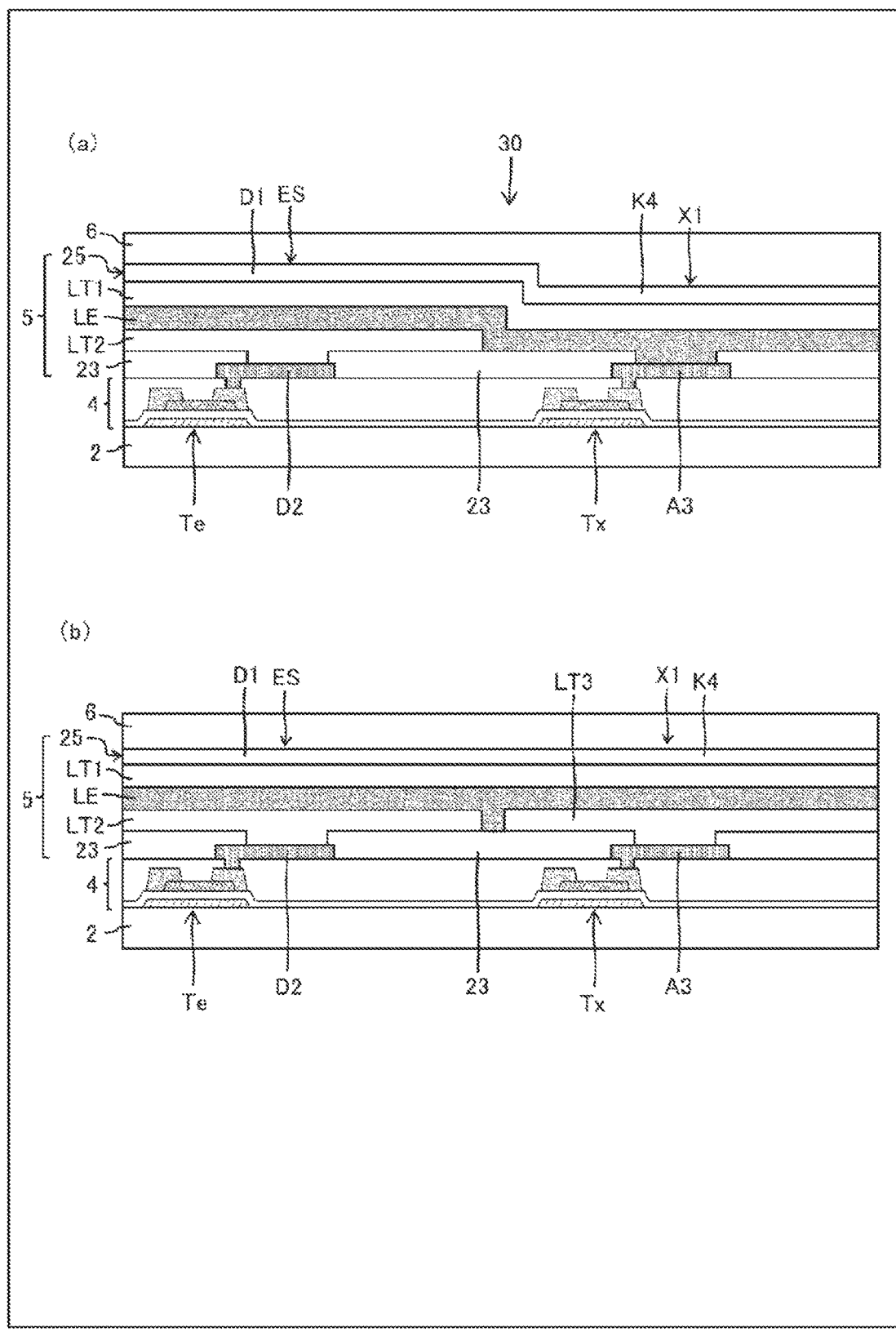
FIGS. 13(a) and (b) are cross-sectional views illustrating other modification examples of the display portion according to the first embodiment.

FIGS. 13(a) and (b) are cross-sectional views illustrating other modification examples of the display portion according to the first embodiment. In FIG. 2, the first electrode D1 and the fourth electrode K4 are connected to different transistors, and the second electrode D2 and the third electrode A3 constitute the common electrode (common anode) 25, but this is not a limitation. As illustrated in FIG. 13(a), the second electrode D2 and the third electrode A3 may be connected to different transistors (Te and Tx), and the first electrode D1 and the fourth electrode K4 may constitute the common electrode (common cathode) 25.

In this case, the second electrode D2, the second charge transport layer LT2 (hole transport layer), the light-emitting layer LE, the first charge transport layer LT1 (electron transport layer), and the first electrode D1 are layered in the light-emitting element ES in that order. The third electrode A3, the light-emitting layer LE, the first charge transport layer LT1 (electron transport layer), and the fourth electrode K4 are layered in the first inspection element X1 in that order. The second electrode D2 is connected to the ELVDD power supply via the transistor Te, and the third electrode A3 is connected to the ELVDD power supply via the transistor Tx. Note that, for the first inspection element X1, a third charge transport layer LT3 having an electron transport function may be provided between the third electrode A3 and the light-emitting layer LE as illustrated in FIG. 13(b).

Figure 14:
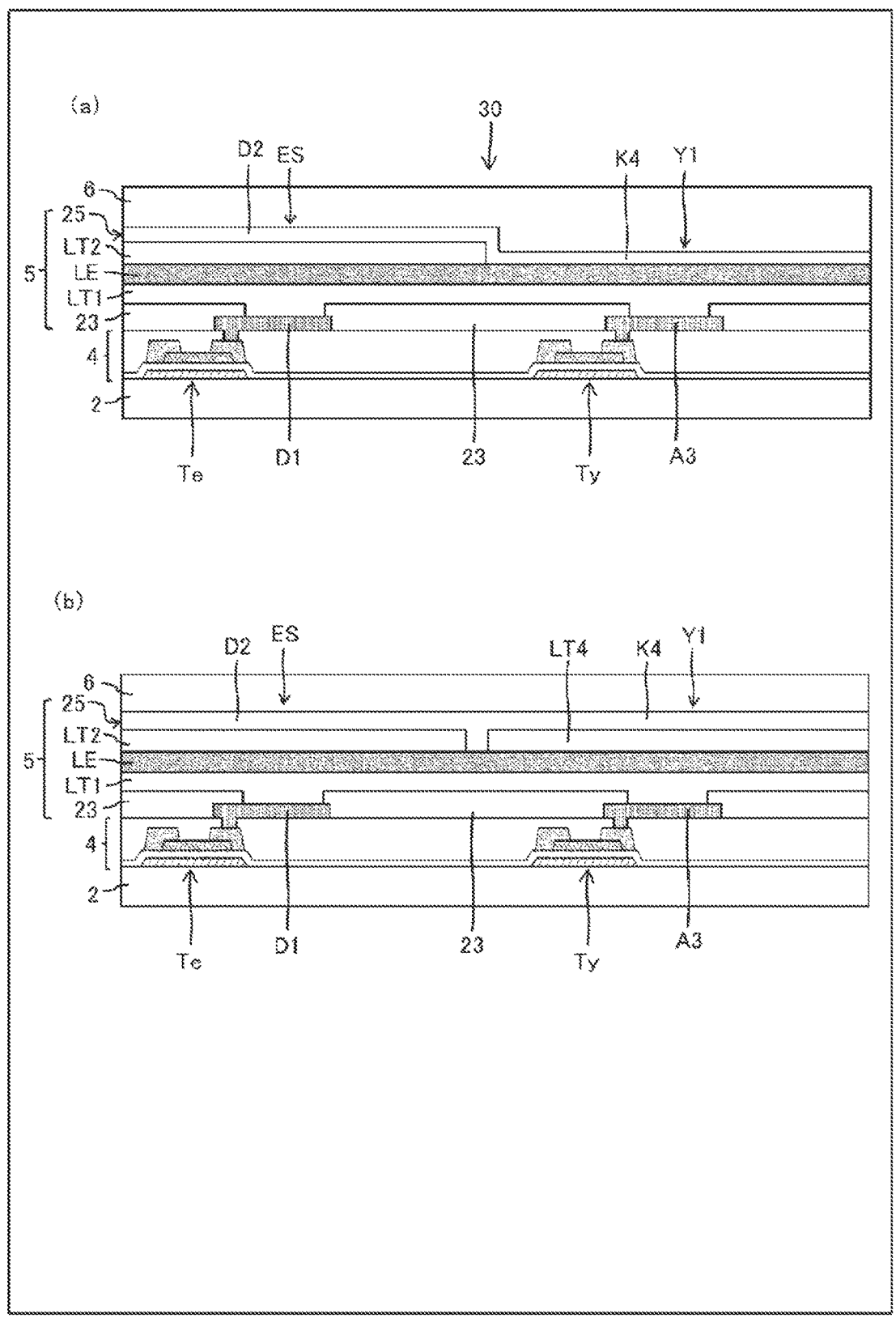
FIGS. 14(a) and (b) are cross-sectional views illustrating modification examples of the display portion according to the second embodiment.

FIGS. 14(a) and (b) are cross-sectional views illustrating a modification example of the display portion according to the second embodiment. As illustrated in FIG. 14(a), the first electrodes D1 and the third electrodes A3 may be connected to different transistors (Te and Ty), and the second electrode D2 and the fourth electrode K4 may constitute the common electrode (common cathode) 25.

In this case, the first electrode D1, the first charge transport layer LT1 (hole transport layer), the light-emitting layer LE, the second charge transport layer LT2 (electron transport layer), and the second electrode D2 are layered in the light-emitting element ES in that order. The third electrode A3, the first charge transport layer LT1 (hole transport layer), the light-emitting layer LE, and the fourth electrode K4 are layered in the first inspection element Y1 in that order. The first electrode D1 is connected to the ELVDD power supply via the transistor Te, and the third electrode A3 is connected to the ELVDD power supply via the transistor Ty. Note that, for the first inspection element Y1, a fourth charge transport layer LT4 having a hole transport function may be provided between the fourth electrode K4 and the light-emitting layer LE as illustrated in FIG. 14(b).

The embodiments described above are for the purpose of illustration and description and are not intended to be limiting. It will be apparent to those skilled in the art that many variations will be possible in accordance with these examples and descriptions.

The invention claimed is:

1. A display device provided with a light-emitting element including, for each subpixel, a first electrode, a second electrode, a light-emitting layer provided between the first electrode and the second electrode, a first charge transport layer provided between the first electrode and the light-emitting layer, and a second charge transport layer provided between the light-emitting layer and the second electrode, the display device comprising:
    a first inspection element including a third electrode and a fourth electrode, wherein the first inspection element includes the light-emitting layer and the first charge transport layer, provided between the third electrode and the fourth electrode and common to the light-emitting element, the light-emitting element is driven in accordance with characteristics of the first inspection element, wherein the first charge transport layer has a function of transporting first charge, the second charge transport layer has a function of transporting second charge, and the first inspection element is a single-charge element configured to make mainly the former out of the first charge and the second charge flow.

2. The display device according to claim 1, wherein the first charge is an electron, and the second charge is a hole.

3. The display device according to claim 2, wherein the light-emitting layer and the third electrode are in contact with each other in the first inspection element.

4. The display device according to claim 2, wherein a third charge transport layer having an electron transport function is provided between the light-emitting layer and the third electrode, in the first inspection element.

5. The display device according to claim 2, wherein the first electrode and the fourth electrode are connected to different transistors, and the second electrode and the third electrode constitute a continuous common electrode.

6. The display device according to claim 3, wherein the second electrode and the third electrode are connected to different transistors, and the first electrode and the fourth electrode constitute a continuous common electrode.

7. The display device according to claim 3, wherein the first charge transport layer includes nanoparticles of a metal oxide.

8. The display device according to claim 7, wherein the metal oxide is any one of $ZnO$, $SnO_2$, or $TiO_2$.

9. The display device according to claim 1, wherein the first charge is a hole, and the second charge is an electron.

10. The display device according to claim 9, wherein the light-emitting layer and the fourth electrode are in contact with each other in the first inspection element.

11. The display device according to claim 9, wherein a fourth charge transport layer having a hole transport function is provided between the light-emitting layer and the fourth electrode.

12. The display device according to claim 9, wherein the second electrode and the fourth electrode are connected to different transistors, and the first electrode and the third electrode constitute a continuous common electrode.

13. The display device according to claim 9, wherein the first electrode and the third electrode are connected to different transistors, and the second electrode and the fourth electrode constitute a continuous common electrode.

14. The display device according to claim 1, further comprising
a second inspection element including a fifth electrode and a sixth electrode,
wherein the second inspection element includes the light-emitting layer and the second charge transport layer provided between the fifth electrode and the sixth electrode and common to the light-emitting element, and
the light-emitting element is driven in accordance with characteristics of the first inspection element and the second inspection element.

15. The display device according to claim 14, wherein the second inspection element is a single-charge element configured to make mainly the latter out of the first charge and the second charge flow.

16. The display device according to claim 1, wherein the light-emitting element and the first inspection element are formed adjacent to each other.

17. The display device according to claim 1, further comprising
a voltage measurement unit configured to measure a voltage of the third electrode or the fourth electrode of the first inspection element.

18. The display device according to claim 1, wherein a power supply is connected to any one of the third electrode or the fourth electrode of the first inspection element.

19. The display device according to claim 1, wherein the first inspection element is provided for each subpixel.

20. The display device according to claim 1, wherein the first inspection element is provided for each subpixel row constituted by a plurality of subpixels arranged in a row direction.

* * * * *